United States Patent
Matsumoto et al.

(10) Patent No.: US 9,691,585 B2
(45) Date of Patent: Jun. 27, 2017

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventors: Hiroshi Matsumoto, Yokohama (JP); Munehiro Ogasawara, Hiratsuka (JP); Ryoichi Yoshikawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/699,216

(22) Filed: Apr. 29, 2015

(65) Prior Publication Data
US 2015/0340196 A1 Nov. 26, 2015

(30) Foreign Application Priority Data

May 23, 2014 (JP) .................................. 2014-107559
Apr. 17, 2015 (JP) .................................. 2015-085085

(51) Int. Cl.
*H01J 37/147* (2006.01)
*H01J 37/20* (2006.01)
(Continued)

(52) U.S. Cl.
CPC ........ *H01J 37/1471* (2013.01); *H01J 37/045* (2013.01); *H01J 37/147* (2013.01);
(Continued)

(58) Field of Classification Search
CPC .. H01J 37/3174; H01J 37/045; H01J 37/3177; H01J 2237/0435;
(Continued)

(56) References Cited

U.S. PATENT DOCUMENTS 5,260,579 A  11/1993  Yasuda et al.
7,777,201 B2  8/2010  Fragner et al.
(Continued)

FOREIGN PATENT DOCUMENTS

JP  05-166707  7/1993
JP  2014-112639  6/2014
(Continued)

OTHER PUBLICATIONS

U.S. Appl. No. 14/721,363, filed May 26, 2015, Matsumoto.
Office Action issued Nov. 7, 2016, in Taiwanese Patent Application No. 104114130 (with English-language translation).

*Primary Examiner* — Dionne H Pendleton
(74) *Attorney, Agent, or Firm* — Oblon, McClelland, Maier & Neustadt, L.L.P.

(57) ABSTRACT

A multi charged particle beam writing method includes, shifting a writing position of each corresponding beam to a next writing position by performing another beam deflection of multi charged particle beams, in addition to the beam deflection for a tracking control, while continuing the beam deflection for the tracking control after the maximum writing time has passed; emitting the each corresponding beam in the "on" state to the next writing position having been shifted of the each corresponding beam, during a corresponding writing time while continuing the tracking control; and returning a tracking position such that a next tracking start position is a former tracking start position where the tracking control was started, by resetting the beam deflection for the tracking control after emitting the each corresponding beam to the next writing position having been shifted at least once of the each corresponding beam while continuing the tracking control.

12 Claims, 11 Drawing Sheets

(51) Int. Cl.
  *H01J 37/302* (2006.01)
  *H01J 37/317* (2006.01)
  *H01J 37/04* (2006.01)

(52) U.S. Cl.
  CPC ............ *H01J 37/20* (2013.01); *H01J 37/302* (2013.01); *H01J 37/3026* (2013.01); *H01J 37/317* (2013.01); *H01J 37/3174* (2013.01); *H01J 2237/043* (2013.01); *H01J 2237/202* (2013.01); *H01J 2237/20278* (2013.01); *H01J 2237/304* (2013.01); *H01J 2237/30483* (2013.01); *H01J 2237/3175* (2013.01)

(58) Field of Classification Search
  CPC ....... H01J 2237/043; H01J 2237/04924; H01J 2237/1205; H01J 2237/15; H01J 2237/1501; H01J 2237/1532; H01J 2237/202; H01J 2237/304; H01J 2237/30433; H01J 2237/30455; H01J 2237/31715; H01J 2237/31725; H01J 2237/31754; H01J 2237/31776; H01J 2237/31793; H01J 2237/31798; H01J 37/1471; H01J 37/1472; H01J 37/20; H01J 37/3007; H01J 37/3026; H01J 37/304; H01J 2237/30483; H01J 2237/20278; B82Y 10/00; B82Y 40/00
  See application file for complete search history.

(56) References Cited

U.S. PATENT DOCUMENTS

| | | | |
|---|---|---|---|
| 8,222,621 B2 | 7/2012 | Fragner et al. | |
| 2003/0025088 A1 | 2/2003 | Oae et al. | |
| 2014/0124684 A1 | 5/2014 | Matsumoto et al. | |
| 2014/0127628 A1* | 5/2014 | Fujimura | H01J 37/3174 430/296 |
| 2014/0168629 A1* | 6/2014 | Nishida | H01J 37/304 355/77 |

FOREIGN PATENT DOCUMENTS

| | | |
|---|---|---|
| TW | 200952022 A1 | 12/2009 |
| TW | 201115615 A1 | 5/2011 |

* cited by examiner

| 25 | 17 | 9 | 1 |
|----|----|---|---|
| 25 | 17 | 9 | 1 |
| 25 | 17 | 9 | 1 |
| 25 | 17 | 9 | 1 |

| 25 | 25 | 25 | 25 |
|----|----|----|----|
| 17 | 17 | 17 | 17 |
| 9  | 9  | 9  | 9  |
| 1  | 1  | 1  | 1  |

FIG. 11

| 29 | 21 | 13 | 5 |
|----|----|----|---|
| 29 | 21 | 13 | 5 |
| 29 | 17 | 9  | 1 |
| 29 | 17 | 9  | 1 |

FIG. 12

| 31 | 23 | 15 | 7 |
|----|----|----|---|
| 29 | 21 | 13 | 5 |
| 27 | 19 | 11 | 3 |
| 25 | 17 | 9  | 1 |

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-107559 filed on May 23, 2014 in Japan, and prior Japanese Patent Application No. 2015-085085 filed on Apr. 17, 2015 in Japan, the entire contents of which are incorporated herein by reference.

BACKGROUND OF THE INVENTION

Field of the Invention

Embodiments of the present invention relate generally to a multi charged particle beam writing method and a multi charged particle beam writing apparatus, and more specifically, for example, relate to a method for reducing the writing time of multi-beam writing by tracking deflection.

Description of Related Art

In recent years, with high integration of LSI, the line width (critical dimension) required for circuits of semiconductor devices is becoming progressively narrower. As a method for forming an exposure mask (also called a reticle) used to form circuit patterns on these semiconductor devices, the electron beam (EB) writing technique having excellent resolution is employed.

As an example employing the electron beam writing technique, a writing apparatus using multiple beams (multi-beams) can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multiple beams are formed by letting portions of an electron beam emitted from an electron gun assembly pass through a corresponding hole of a plurality of holes formed in the mask, blanking control is performed for each beam, and each unblocked beam is reduced by an optical system and deflected by a deflector so as to irradiate a desired position on a target object or "sample".

In multi beam writing, a high-speed throughput can be realized as described above. The shorter the one shot cycle of multi-beams is, the higher the throughput becomes. Conventionally, pixels are defined by dividing a writing region in the surface of the target object into a plurality of mesh regions by the beam size. Then, during irradiation of multiple beams of each shot to the target object placed on the stage moving at a fixed speed, each beam irradiation is executed while each beam performs a tracking operation following the stage movement so that a pixel to be irradiated by each beam may not be displaced by the stage movement. After one shot, the tracking operation is reset to swing back each beam, and the deflection position is shifted to a next pixel to be irradiated. Then, in the same way as described above, each beam irradiation is performed while executing the tracking operation. Thus, a pattern is written by performing necessary beam irradiation for each of the entire pixels.

In order to avoid a glitch generated in amplifiers for deflectors used for performing a tracking operation, a low pass filter (LPF) is built in each amplifier. For performing a highly accurate tracking operation, it is necessary to use an output signal having passed through the LPF in the tracking operation. In that case, a long stabilization period (settling time) is needed for the amplifier for tracking, in order to reset the tracking operation and shift to a next tracking operation. As the settling time, for example, 10% or more of the maximum irradiation time (maximum exposure time) of each beam is needed. Therefore, there is a problem that the settling time for resetting the tracking operation degrades the writing speed and further, the throughput.

In connection with the multi-beam technique, there is disclosed a technique where a tracking operation in response to a stage movement is performed while multi beams are continuously scanned in one direction by the raster scan method (refer to, e.g., Japanese Published Unexamined Patent Application (JP-A) No. 05-166707).

BRIEF SUMMARY OF THE INVENTION

According to one aspect of the present invention, a multi charged particle beam writing method includes emitting each corresponding beam in an "on" state of multi charged particle beams to a writing position of the each corresponding beam during a corresponding writing time within a maximum writing time which was pre-set, while performing a beam deflection for tracking control such that the writing position of the each corresponding beam of the multi charged particle beams collectively follow a movement of a stage, shifting the writing position of the each corresponding beam to a next writing position of the each corresponding beam by performing another beam deflection of the multi charged particle beams, in addition to the beam deflection for the tracking control, while continuing the beam deflection for the tracking control after the maximum writing time has passed, emitting the each corresponding beam in the "on" state of the multi charged particle beams to the next writing position having been shifted of the each corresponding beam, during a corresponding writing time within the maximum writing time while continuing the tracking control, and returning a tracking position such that a next tracking start position is a former tracking start position where the tracking control was started, by resetting the beam deflection for the tracking control after emitting the each corresponding beam to the next writing position having been shifted at least once of the each corresponding beam while continuing the tracking control.

According to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam of the multiple beams having passed through the plurality of openings of the aperture member, a blanking aperture member configured to block each beam having been deflected to be in an "off" state by at least one of the plurality of blankers, a first deflector configured to collectively deflect each beam in an "on" state having passed through the blanking aperture member to a writing position of the each beam, a second deflector configured to collectively deflect the each beam in the "on" state having passed through the blanking aperture member in such a way as to follow a movement of the stage, and a deflection control unit configured to control the first deflector to deflect the each beam to a corresponding writing position, and after a writing time has passed, to deflect the each beam to be shifted to a next corresponding writing position, and to control the second deflector to continue tracking of the each beam while the each beam irradiates the writing position and while the each beam irradiates the writing position which has been shifted at least once, and after the each beam irradiates the writing position which has been shifted at least once, to return a tracking position such that a next tracking start position is a former tracking start position where tracking control was started, by resetting the beam deflection for the tracking control.

Further, according to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam of the multiple beams having passed through the plurality of openings of the aperture member, a blanking aperture member configured to block each beam having been deflected to be in an "off" state by at least one of the plurality of blankers, a deflector configured to collectively deflect the each beam in an "on" state having passed through the blanking aperture member to a writing position of the each beam, and collectively deflect the each beam in such a way as to follow a movement of the stage, and a deflection control unit configured to control the deflector to deflect the each beam to a corresponding writing position, and after a writing time has passed, to deflect the each beam to be shifted to a next corresponding writing position, and to control the deflector to continue tracking of the each beam while the each beam irradiates the writing position and while the each beam irradiates the writing position which has been shifted at least once, and after the each beam irradiates the writing position which has been shifted at least once, to return a tracking position such that a next tracking start position is a former tracking start position where tracking control was started, by resetting the beam deflection for the tracking control.

BRIEF DESCRIPTION OF THE DRAWINGS

FIG. 7 shows an example of numbers of beams to write respective pixels in a grid concerned according to the first embodiment;

FIG. 10 shows another example of numbers of beams to write respective pixels in a grid concerned according to the first embodiment;

FIG. 11 shows another example of numbers of beams to write respective pixels in a grid concerned according to the first embodiment;

FIG. 12 shows another example of numbers of beams to write respective pixels in a grid concerned in a comparative example of the first embodiment.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used.

In the following embodiments, there will be described a multi charged particle beam writing method and apparatus that can reduce the writing time.

First Embodiment

Figure 1:
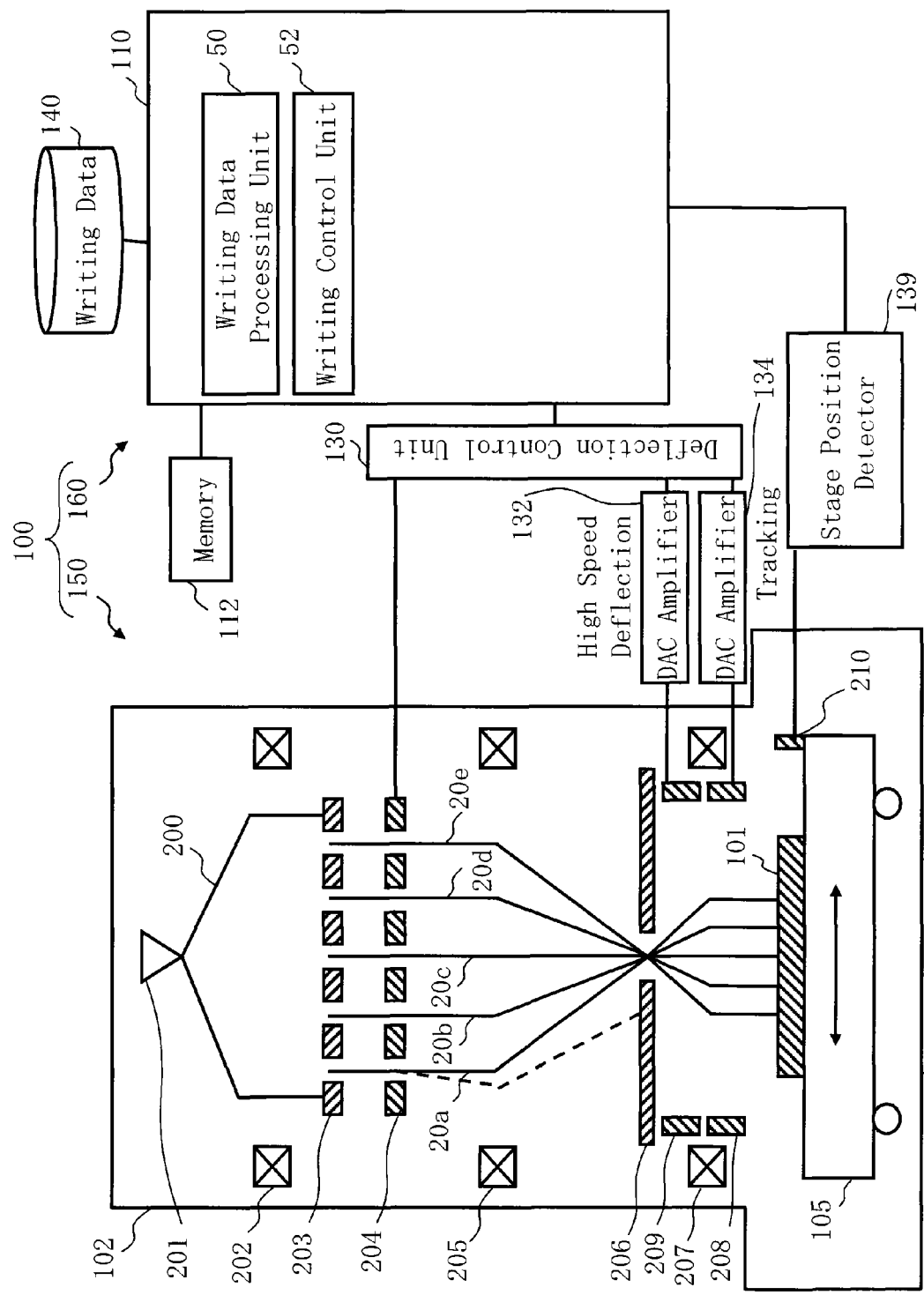
FIG. 1 is a schematic diagram showing a configuration of a writing apparatus according to the first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and deflectors 208 and 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105.

The control unit 160 includes a control computer 110, a memory 112, a deflection control circuit 130 (deflection control unit), a DAC (digital-analog converter) amplifier units 132 and 134, a stage position detector 139 and a storage device 140 such as a magnetic disk drive. The control computer 110, the memory 112, the deflection control circuit 130, the stage position detector 139 and the storage device 140 are connected with each other through a bus (not shown). Writing data is input into the storage device 140 (storage unit) from the outside, and stored therein. The DAC amplifier units 132 and 134 are connected to the deflection control circuit 130. The DAC amplifier unit 132 is connected to the deflector 209, and the DAC amplifier unit 134 is connected to the deflector 208.

In the control computer 110, there are arranged a writing data processing unit 50 and a writing control unit 52. Each function, such as the writing data processing unit 50 and the writing control unit 52 may be configured by hardware such as an electric circuit, or by software such as a program causing a computer to implement these functions. Alternatively, it may be configured by a combination of hardware and software. Data which is input and output to/from the writing data processing unit 50 and the writing control unit 52, and data being operated are stored in the memory 112 each time.

FIG. 1 shows a configuration necessary for explaining the first embodiment. Other configuration elements generally necessary for the writing apparatus 100 may also be included.

Figure 2:
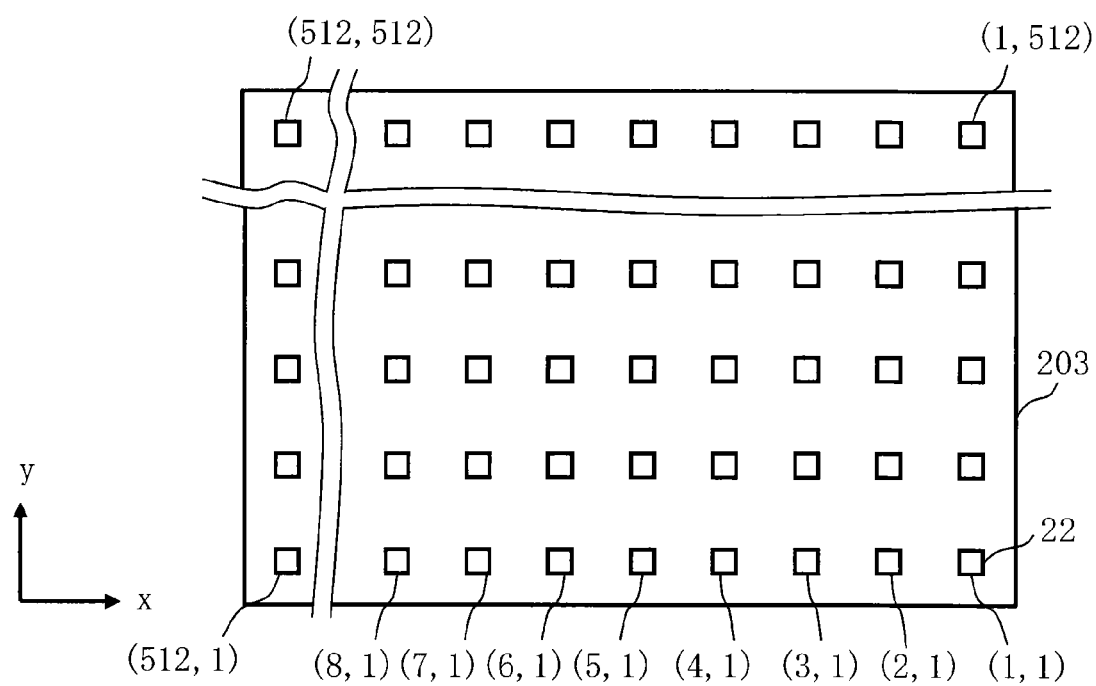
FIG. 2 is a conceptual diagram showing a structure of an aperture member according to the first embodiment.

FIG. 2 is a conceptual diagram showing an example of the structure of an aperture member according to the first embodiment. In FIG. 2, holes (openings) 22 of m rows long (y direction) and n columns wide (x direction) (m≥2, n≥2) are formed, like a matrix, at a predetermined arrangement pitch in the aperture member 203. In FIG. 2, for example, holes 22 of 512 (rows)×512 (columns) are formed in the length and width (x and y) directions. Each of the holes 22 is a quadrangle of the same dimensional shape. Alternatively, each of the holes 22 can be a circle of the same circumference. Multi-beams 20 are formed by letting portions of an electron beam 200 respectively pass through a corresponding hole of a plurality of holes 22. The case in which the holes 22 of two or more rows and columns are arranged in the length and width (x and y) directions is shown here, but the arrangement is not limited thereto. For example, it is also acceptable that a plurality of holes 22 are arranged in only one row (x direction) or in only one column (y direction). That is, in the case of only one row, there are arranged a plurality of holes 22 as a plurality of columns, and in the case of only one column, there are arranged a plurality of holes 22 as a plurality of rows. Moreover, the method of arranging the holes 22 is not limited to the case of FIG. 2 where holes are arranged like a grid in the length and width directions. For example, with respect to the kth row and the (k+1)th row, which are arrayed in the length direction (y direction), each hole in the kth row and each hole in the (k+1)th row may be mutually displaced in the width direction (x direction) by a dimension "a". Similarly, each hole in the (k+1)th row and each hole in the (k+2)th row may be mutually displaced in the width direction (x direction) by a dimension "b", for example.

In the blanking plate 204, a passage hole (opening) for passage of each of multi-beams is formed at a position corresponding to the arrangement position of each hole 22 of the aperture member 203 shown in FIG. 2. Then, a pair of, that is two, electrodes (blanker: blanking deflector) for blanking deflection is arranged at the opposite sides of and close to each passage hole. Moreover, close to each passage hole, there is arranged a control circuit for applying a deflection voltage to one of the two electrodes of the blanker for a passage hole. The other one of the two electrodes each for each beam is grounded.

The electron beam 20 passing through a corresponding passage hole is deflected by the voltage independently applied to the two electrodes being a pair. Blanking control is performed by this deflection. Blanking deflection is performed for each corresponding beam of the multi-beams. Thus, a plurality of blankers respectively perform blanking deflection of a corresponding beam of the multi-beams having passed through a plurality of holes 22 (openings) of the aperture member 203.

Figure 3:
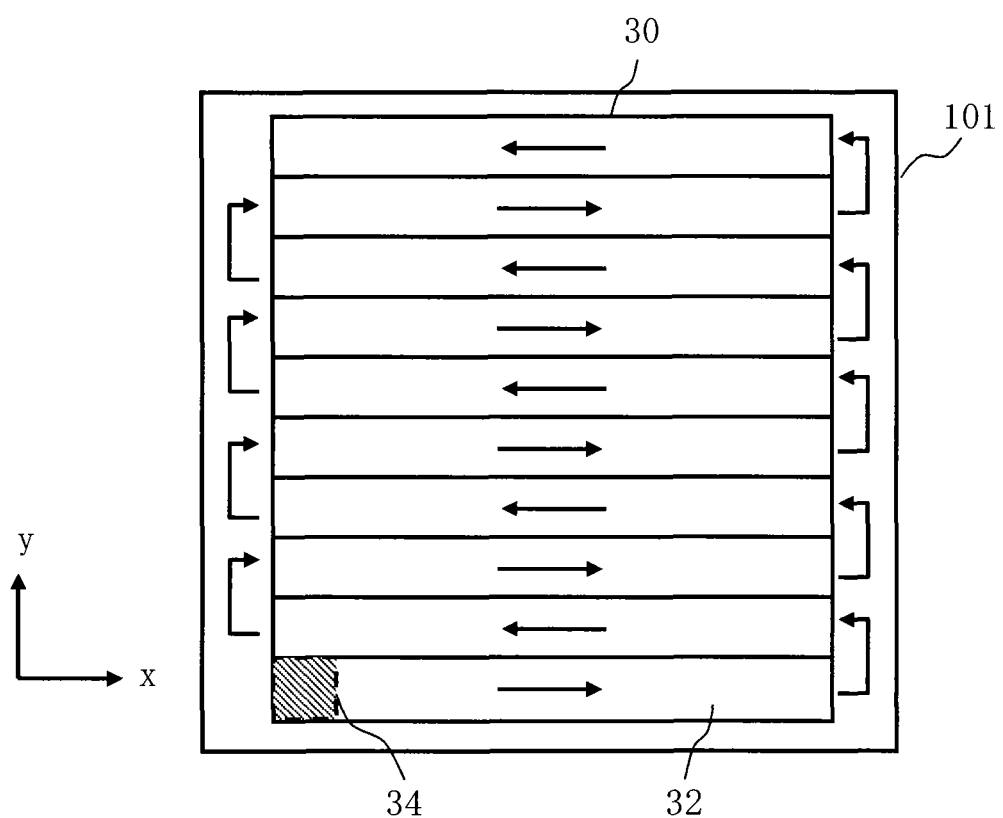
FIG. 3 is a conceptual diagram explaining an example of a writing operation according to the first embodiment.

FIG. 3 is a conceptual diagram explaining an example of a writing operation according to the first embodiment. As shown in FIG. 3, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that an irradiation region 34 which can be irradiated by one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is, for example, continuously moved at a predetermined speed. After writing the first stripe region 32, the stage position is moved in the −y direction to make an adjustment such that the irradiation region 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal, at the maximum, to the number of the holes 22 are formed at a time by multi-beams which have been formed by passing through respective corresponding holes 22 of the aperture member 203.

Figure 4:
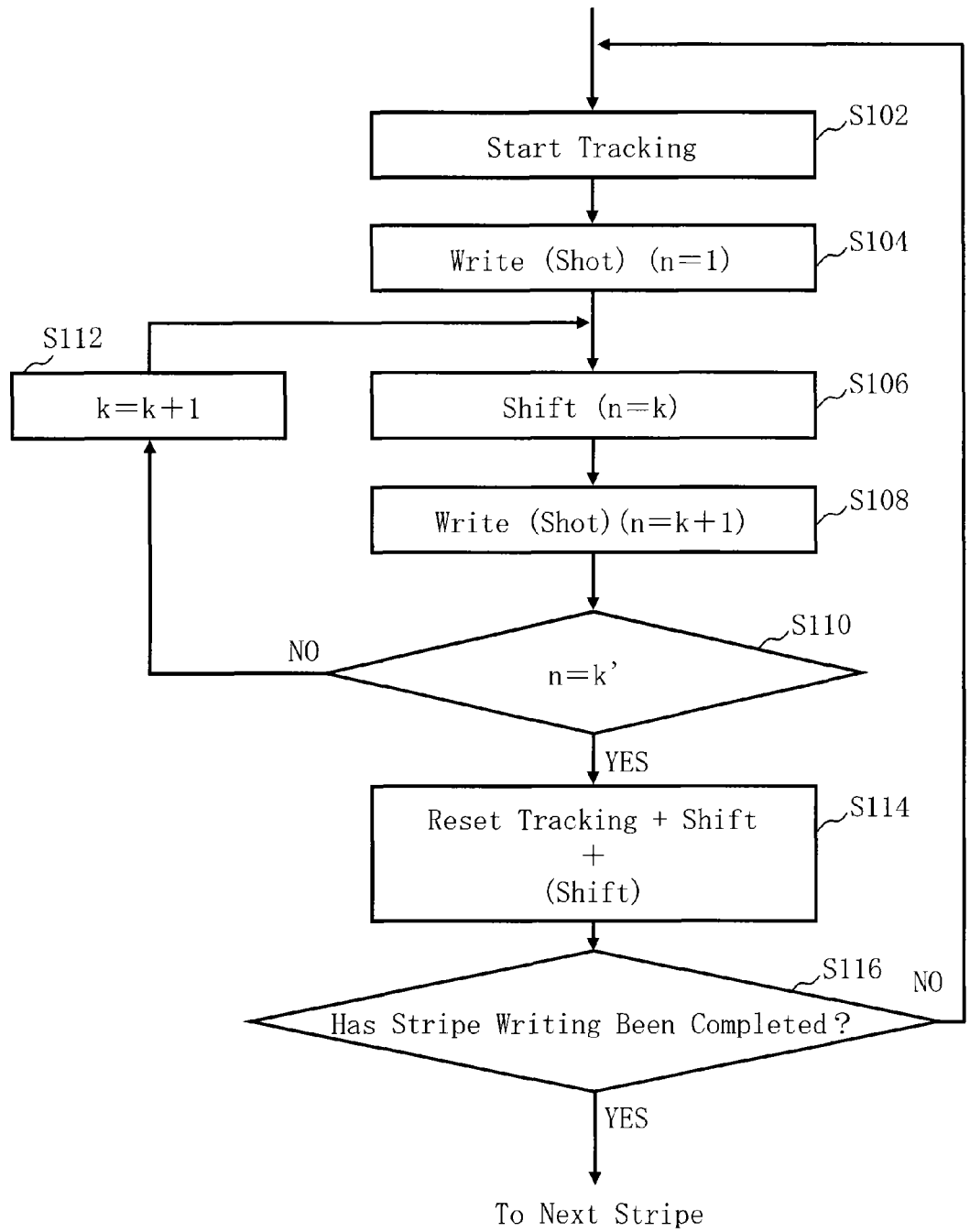
FIG. 4 is a flowchart showing main steps of a writing method according to the first embodiment.

FIG. 4 is a flowchart showing main steps of a writing method according to the first embodiment. In FIG. 4, the writing method of the first embodiment executes a series of steps: a tracking start step (S102), a writing step (S104), a shift step (S106), a writing step (S108), a determination step (S110), an addition step (S112), a tracking reset step (S114), and a determination step (S116).

Figure 5:
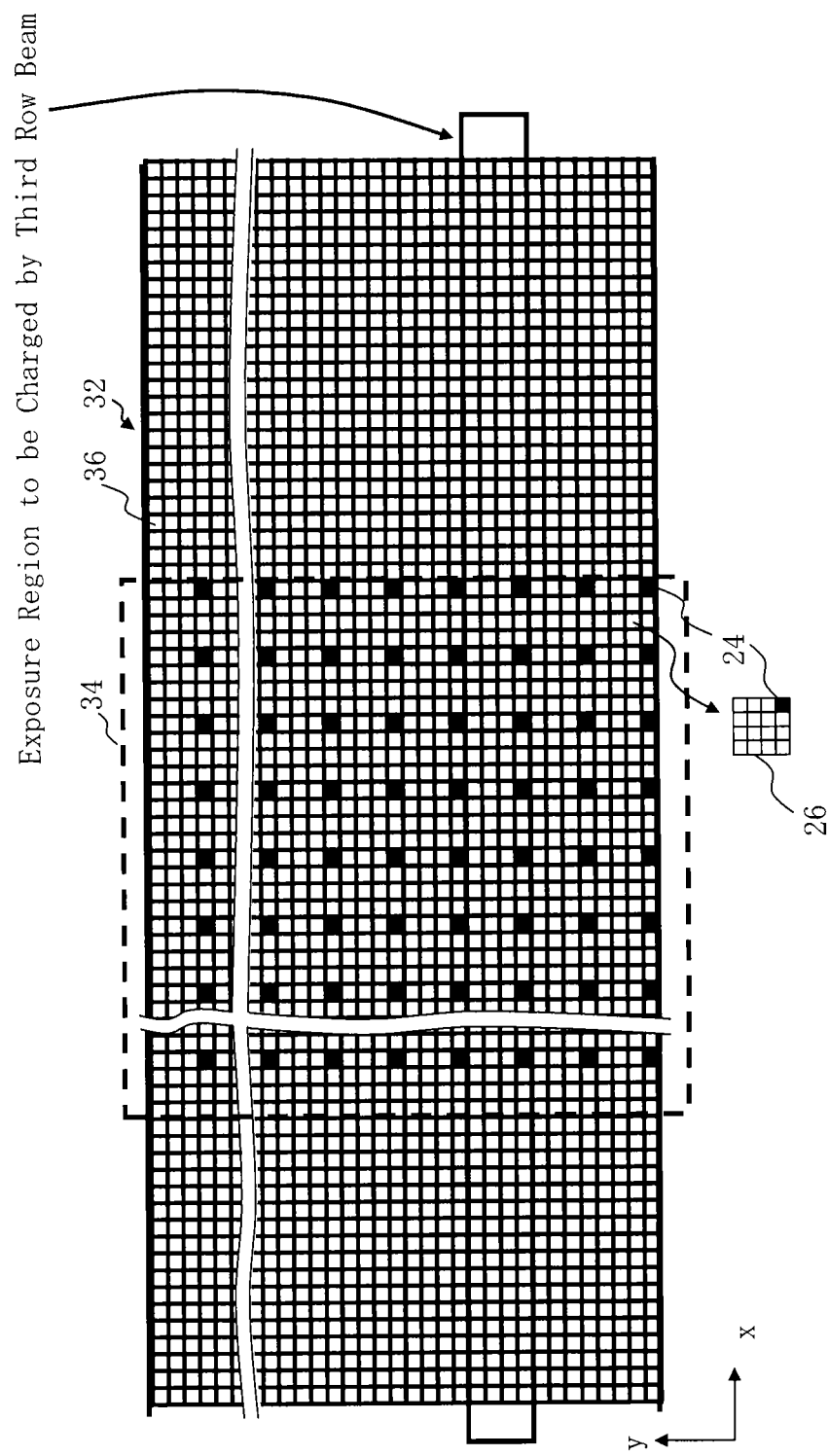
FIG. 5 shows an example of an irradiation region of multi-beams and a pixel to be written according to the first embodiment.

FIG. 5 shows an example of an irradiation region of multi-beams and a pixel to be written according to the first embodiment. In FIG. 5, the stripe region 32 is divided into a plurality of mesh regions by the beam size of multi-beams, for example. Each mesh region serves as a pixel 36 to be written (writing position). The size of the pixel 36 to be written is not limited to the beam size. For example, it may be 1/n (n being an integer of 1 or more) of the beam size. FIG. 5 shows the case where the writing region of the target object 101 is divided into a plurality of stripe regions 32 by the width (of short side) (size in the y direction) being substantially the same as the length size of the irradiation region 34, which can be irradiated by one irradiation of the multi-beam 20, for example. The width of the stripe region 32 is not limited to this. It is also preferable for the width of the stripe region 32 to be n times (n being an integer of 1 or more) the size of the irradiation region 34. FIG. 5 shows the case of multi-beams of 512×512 (rows by columns). In the irradiation region 34, there are shown a plurality of pixels 24 which can be irradiated by one irradiation of the multi-beams 20. In other words, the pitch between the adjacent pixels 24 is the pitch between beams of the multi-beams. In the example of FIG. 5, one grid 26 being a square region is surrounded at four corners by four pixels 24, and one of the four pixels 24 is included in the grid 26 concerned. In the case of FIG. 5, each grid 26 is configured by 4×4 pixels.

Figure 6:
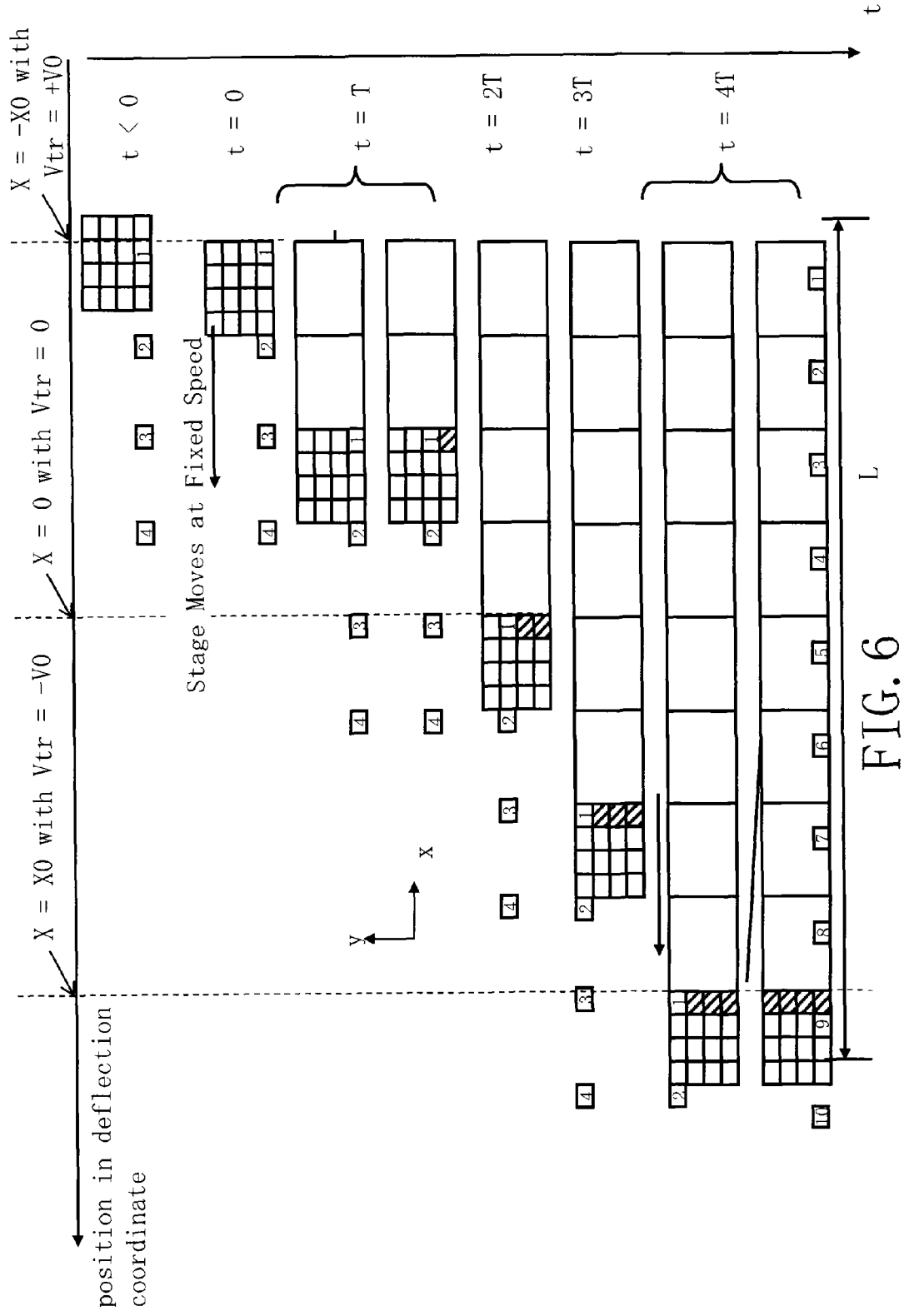
FIG. 6 illustrates an example of a writing method of multi-beams according to the first embodiment.

FIG. 6 illustrates an example of a writing method of multi-beams according to the first embodiment. FIG. 6 shows some grids to be written by respective beams of the coordinates (1, 3), (2, 3), (3, 3), . . . , (512, 3) in the third row from the bottom, where rows are arrayed in the y direction, in the multi-beams for writing the stripe region 32 shown in FIG. 5. In the case of FIG. 6, while the XY stage 105 moves the distance of eight beam pitches, four pixels are written (exposed), for example.

First, the writing data processing unit 50 reads writing data from the storage device 140, and performs a plurality of stages of data conversion processing to generate shot data. Shot data is generated for each pixel 36, and then, the writing time (irradiation time) is calculated. For example, when no pattern is formed in a target pixel 36, since no beam irradiation is performed, an identification code indicating writing time zero or no beam irradiation is defined. Here, the maximum writing time T (maximum exposure time) in one multi-beam shot is set in advance. It is preferable that the irradiation time of each beam to be actually applied is obtained in proportion to a calculated area density of a pattern. Moreover, it is preferable that the irradiation time of each beam to be finally calculated is a time period equivalent to an irradiation amount (dose) after correction in which a dimensional variation (not shown) due to a phenomenon such as the proximity effect, the fogging effect result, and the loading effect has been corrected using an irradiation amount. Therefore, the irradiation time of each beam to be actually applied differs for each beam. The writing time (irradiation time) of each beam is obtained as a value within the maximum writing time T.

In the tracking start step (S102), tracking control by beam deflection is started such that writing positions of respective beams of the multi-beams 20 collectively follow the movement of the XY stage 105. Specifically, the stage position detector 139 measures the position of the XY stage 105 by irradiating a laser to the mirror 210 and receiving a catoptric light from the mirror 210. The measured position of the XY stage 105 is output to the control computer 110. In the control computer 110, the writing control unit 52 outputs the position information on the XY stage 105 to the deflection control circuit 130. In the deflection control circuit 130, deflection amount data (tracking deflection data) is calculated so that beam deflection may be performed to follow the movement of the XY stage 105. Tracking deflection data being a digital signal is output to the DAC amplifier 134. In the DAC amplifier 134, the digital signal is converted to an analog signal and amplified to be applied as a tracking deflection voltage to the deflector 208.

In the writing step (S104), while performing tracking control by beam deflection such that writing positions of respective beams of the multi-beams collectively follow the movement of the XY stage 105, the writing unit 150 emits a corresponding beam in the "on" state of the multi-beams 20 to a corresponding writing position during a corresponding writing time within a pre-set maximum writing time. Specifically, it operates as described below.

The electron beam 200 emitted from the electron gun assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated by the electron beam 200. For example, a plurality of quadrangular electron beams (multi-beams) 20a to 20e are formed by letting portions of the electron beam 200 irradiating the positions of a plurality of holes pass through a corresponding hole of the plurality of holes of the aperture member 203 respectively. The multi-beams 20a to 20e respectively pass through corresponding blankers (first deflector: separate blanking system) of the blanking plate 204. Each blanker deflects (performs blanking deflection) a separately passing electron beam 20 to be beam "on" during a calculated writing time (irradiation time) and to be beam "off" during the other time period.

The multi-beams 20a, 20b, . . . , 20e having passed through the blanking plate 204 are reduced by the reducing lens 205, and travel toward the hole in the center of the limiting aperture member 206. At this time, the electron beam 20 deflected to be beam "off" by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 or was deflected to be beam "on" passes through the hole in the center of the limiting aperture member 206 as shown in FIG. 1. Blanking control is performed by on/off of the separate blanking system in order to control on/off of the beam. Thus, the limiting aperture member 206 blocks each beam which was deflected to be in the "off" state by the separate blanking system. One beam shot is formed by a beam which has been formed during from a beam "on" state to a beam "off" state and has passed through the limiting aperture member 206. The multi beams 20 having passed through the limiting aperture member 206 are focused by the objective lens 207 in order to be a pattern image of a desired reduction rate, and respective beams (the entire multi beams 20) having passed through the limiting aperture member 206 are collectively deflected in the same direction by the deflector 209 so as to irradiate respective writing positions (irradiation positions) on the target object 101. For example, while the XY stage 105 is continuously moving, tracking control is performed by the deflector 208 so that writing positions (irradiation positions) of beams may follow the movement of the XY stage 105. Ideally, multi beams 20 to irradiate at a time are aligned at pitches obtained by multiplying the arrangement pitch of a plurality of holes of the aperture member 203 by the desired reduction rate described above. The writing apparatus 100 executes a writing operation by a method that sequentially performs irradiation of a shot beam while shifting the writing position, and when writing a desired pattern, a beam needed according to a pattern is controlled to be beam "on" by blanking control.

In the case of FIG. 6, using the beam (1) of the coordinates (1, 3), the first pixel from the right in the first row from the bottom of the grid 26 concerned ("target grid" or "grid of interest") is irradiated by the beam of the first shot during from the time t=0 to the maximum writing time T, for example. The XY stage 105 moves two beam pitches at a fixed speed in the −x direction during the time from t=0 to t=T, for example. During this time period, the tracking operation is continued.

In the shift step (S106), after the maximum writing time T has passed, while the beam deflection for tracking control is continued by the deflector 208, the writing position of each beam is shifted to a next writing position of each beam by performing another beam deflection of the multi-beams 20, in addition to the beam deflection for tracking control. For example, the writing position of each beam is shifted to a next writing position of each beam by collective deflection of the multi-beams 20 by the deflector 209 which is performed separately from the beam deflection for tracking control. In the case of FIG. 6, when it becomes the time t=T, the pixel to be written is shifted from the first pixel from the right in the first row from the bottom of the grid 26 concerned to the first pixel from the right in the second row from the bottom. Since the XY stage 105 is moving at a fixed speed also during this time period, the tracking operation is continued.

In the writing step (S108), while the tracking control is continued, a corresponding beam in the "on" state of the multi-beams 20 is applied to a corresponding shifted writing position of each beam during a corresponding writing time within the maximum writing time T. In the example of FIG. 6, using the beam (1) of the coordinates (1, 3), the first pixel from the right in the second row from the bottom of the grid 26 concerned is irradiated by the beam of the second shot during the time from t=T to t=2T, for example. The XY stage 105 moves two beam pitches at a fixed speed in the −x direction during the time from t=T to t=2T. During this time period, the tracking operation is continued.

In the determination step (S110), the writing control unit 52 determines whether the number of times of beam shots, n, has been performed as many as the number of times, k', having been set in advance. When the beam shot has been performed the number of times, k', it proceeds to the tracking reset step (S114). When the beam shot has not been performed the number of times, k', it proceeds to the addition step (S112). The number of times of beam shots, n, is counted also in the case of beam "off" by the blanking control. In the example of FIG. 6, k'=4.

In the addition step (S112), the writing control unit 52 adds 1 to the number of times, k, returns to the shift step (S106), and repeats each step from the shift step (S106) to the addition step (S112) until beam shot has been performed k' number of times.

As described above, beam shot (writing), shift, beam shot (writing), shift, beam shot (writing), and . . . are repeated. In the case of FIG. 6, when it becomes the time t=2T, the pixel to be written is shifted from the first pixel from the right in the second row from the bottom of the grid 26 concerned to the first pixel from the right in the third row from the bottom. Since the XY stage 105 is moving at a fixed speed also during this time period, the tracking operation is continued. Using the beam (1) of the coordinates (1, 3), the first pixel from the right in the third row from the bottom of the grid 26 concerned is irradiated by the beam of the third shot during the time from t=2T to t=3T, for example. The XY stage 105 moves, for example, two beam pitches at a fixed speed in the −x direction during the time from t=2T to t=3T. During this time period, the tracking operation is continued. When it becomes the time t=3T, the pixel to be written is shifted from the first pixel from the right in the third row from the bottom of the grid 26 concerned to the first pixel from the right in the fourth row from the bottom. Since the XY stage 105 is moving at a fixed speed also during this time period, the tracking operation is continued. Using the beam (1) of the coordinates (1, 3), the first pixel from the right in the fourth row from the bottom of the grid 26 concerned is irradiated by the beam of the fourth shot during the time from t=3T to t=4T, for example. The XY stage 105 moves, for example, two beam pitches at a fixed speed in the −x direction during the time from t=3T to t=4T. During this time period, the tracking operation is continued. By what is described above, writing of the pixels in the first column from the right of the grid 26 concerned has been completed.

In the tracking reset step (S114), after emitting a corresponding beam to a corresponding writing position of each beam which has been shifted at least once, in this case three times, while continuing tracking control, the DAC amplifier 134 returns the tracking position to the tracking start position, where the tracking control was started, by resetting the beam deflection for tracking control. In the case of FIG. 6, when it becomes the time t=4T, tracking of the grid 26 concerned is removed, and the beam is swung back to a new grid concerned shifted by eight beam pitches in the x direction. Although the beam (1) of the coordinates (1,3) has been described in the example of FIG. 6, writing is similarly performed for each corresponding grid with respect to a beam of other coordinates. That is, with respect to a beam of coordinates (n, m), writing of pixels in the first column from the right has been completed for a corresponding grid when the time t=0. For example, with respect to a beam (2) of the coordinates (2,3), writing of pixels in the first column from the right has been completed for a grid adjacent in the −x direction to the grid 26 concerned for the beam (1) of FIG. 6. In swinging back the beam, in order that a next tracking start position may be the new grid 26 concerned shifted by eight beam pitches in the x direction as described above when a settling time Ts has passed, it is preferable, when the time t=4T, to return the tracking position to a position shifted a little in the +x direction from the grid position (the position shifted by eight beam pitches: the former tracking start position) at the time t=0. That is, it is preferable to return the tracking position additionally by the amount of a distance (predetermined distance) larger than the distance obtained by multiplying the stage speed V by Ts. In other words, the tracking position becomes a former tracking start position where the tracking control was started after returning and the settling time Ts had passed.

Since writing of the pixels in the first column from the right of each grid has been completed, when tracking is reset, the deflector 209 performs deflection such that the writing position of each corresponding beam is adjusted (shifted) to coincide with the second pixel from the right in the first row from the bottom (position which has not been written yet) of each grid. In other word, each next corresponding beam in a next "on" state of the multi beams 20 in the next tracking start position is deflected at a next writing position at which a beam has not been emitted.

In the determination step (S116), the writing control unit 52 determines whether writing of a target stripe region has been completed. When writing of the target stripe region has been completed, it moves to a next stripe region. When writing of the target stripe region has not been completed yet, it returns to the tracking start step (S102) and repeats each step from the tracking start step (S102) to the determination step (S116) until writing of the target stripe region has been completed.

Thus, the tracking control of from starting tracking control to resetting beam deflection is performed repeatedly. A tracking distance L in the direction of tracking (−x direction) from starting tracking control to resetting beam deflection for tracking control is the same or substantially the same in each tracking control. Moreover, the tracking distance L in the tracking direction from starting tracking control to resetting beam deflection for tracking control should be longer than the pitch between beams of the multi-beams as shown in FIG. 6. According to the first embodiment, the size of the beam array which configures the multi-beams is large such as 512×512. Therefore, the tracking distance L is controlled as shown in FIG. 6 to be a distance smaller than the size of the beam array configuring the multi-beams, that is smaller than the size of the irradiation region 34 which can be irradiated by one shot.

A tracking distance (advancement distance of the stage) during exposing one pixel is now defined to be lp. In FIG. 5, if defining the beam pitch to be p, the beam size to be a, and the number of beam arrays in the x direction to be nx, since the width in the x direction of the array region 34 is nx×p and the width of the region exposed by each beam of beams in each row is p, the number of pixels in the region of one array row is nx×p$^2$/a$^2$. On the other hand, the number of exposure times while a beam array advances the distance nx×p is nx×p/lp, and the number of pixels exposed by nx beams in each row is nx$^2$×p/lp. Therefore, each pixel on the surface of the target object is multiply exposed by different beams nx$^2$×p/lp)/(nx×p$^2$/a$^2$)=nx×a2/(p×lp)=nx/(p/a)/(lp/a) times. When nx=512, if lp=p=160 nm and a=10 nm, the multiplicity of exposure is 2. If lp=320 nm, the multiplicity of exposure is 1. When the multiplicity of exposure is larger than 1, while there is an effect of increasing the writing precision, such as equalizing the variation in the current value of each beam, the number of times of blanking of the blanking aperture array and the amount of data transmission increase due to the multiplicity. Then, in order not to increase too much the multiplicity, it is preferable that the tracking distance during exposing one pixel is greater than or equal to the beam pitch in the case of the parameters described above. In a case that the multiplicity of exposure is larger than one, at a shift step (S106) and a tracking reset step (S114), each corresponding next beam in a next "on" state of the multi beams 20 in the next tracking start position is deflected to a pixel which is exposed the time equal to or smaller by one than a time of exposure of a pixel exposed at the previous writing step (S104).

As described above, the deflector 209 (first deflector) collectively deflects respective beams in the "on" state having passed through the blanking aperture member 206 to writing positions of the respective beams. The deflector 208 (second deflector) collectively deflects respective beams in the "on" state having passed through the blanking aperture member 206 in such a way as to follow the movement of the XY stage 105. The deflection control circuit 130 controls the deflector 208 to deflect each beam to a corresponding writing position, and, after the writing time has passed, to deflect each beam to be shifted to a next corresponding writing position of each beam, and also controls the deflector 208 to continue tracking of each beam while each beam irradiates the writing position and while each beam irradiates the writing position which has been shifted at least once, and after each beam irradiates the writing position which has been shifted at least once, to return the tracking position to the tracking start position, where the tracking control was started, by resetting the beam deflection for tracking control.

Figure 7:
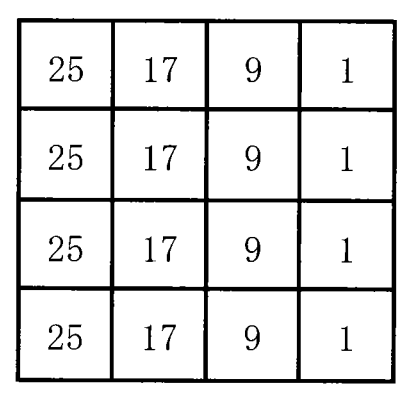

FIG. 7 shows an example of numbers of beams to write respective pixels in a grid concerned according to the first embodiment. FIG. 7 shows the case in which pixels have been shifted by the shift method described with reference to FIG. 6. In FIG. 7, with respect to the grid 26 concerned described in FIG. 6, the pixels in the first column from the right are written by the beam (1), the pixels in the second column from the right are written by the beam (9), the pixels in the third column from the right are written by the beam (17), and the pixels in the fourth column from the right are written by the beam (25).

Figure 8:
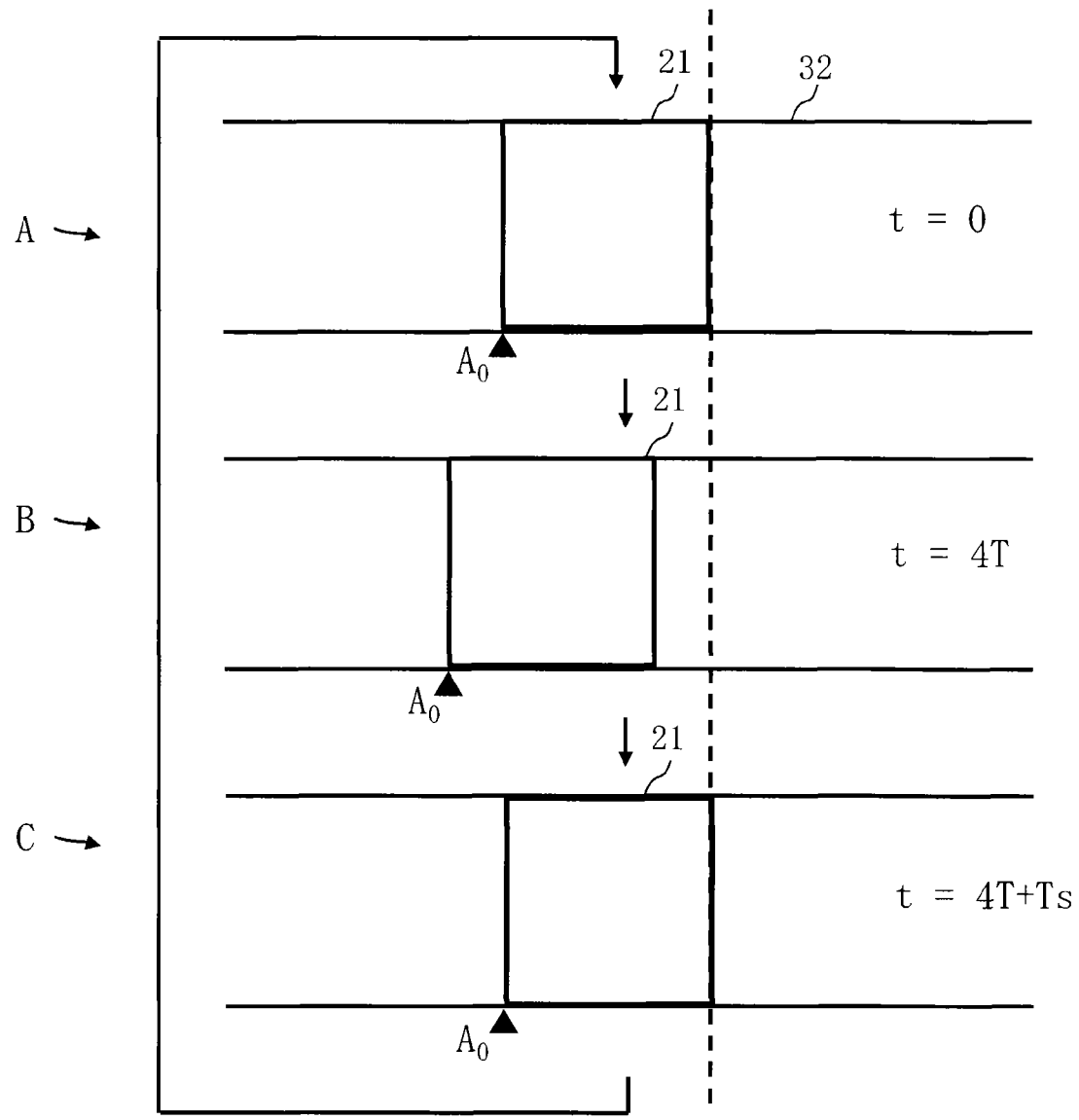
FIG. 8 illustrates a tracking control according to the first embodiment.

FIG. 8 illustrates a tracking control according to the first embodiment. In FIG. 8, when tracking is started, the deflector 208 performs tracking deflection for a reference position A0 of a region 21 in the stripe region 32 to be written corresponding to the irradiation region 34 which can be irradiated by one irradiation of the multi-beams 20 in such a way as to follow the movement of the XY stage 105. The reference position A0 at the time of starting tracking (time t=0) moves eight beam pitches in the −x direction at the time of t=4T, for example. During this time period, the deflector 208 continues tracking. Then, the beam is swung back by resetting tracking at the time of t=4T, and the region 21 in the stripe region 32 to be written corresponding to the irradiation region 34 shifts to a region away from the former region by eight beam pitches in the x direction. Then, after the settling time Ts of the DAC amplifier unit 134 has passed, a next tracking is started. A tracking cycle is executed by repeating this operation.

Figure 9:
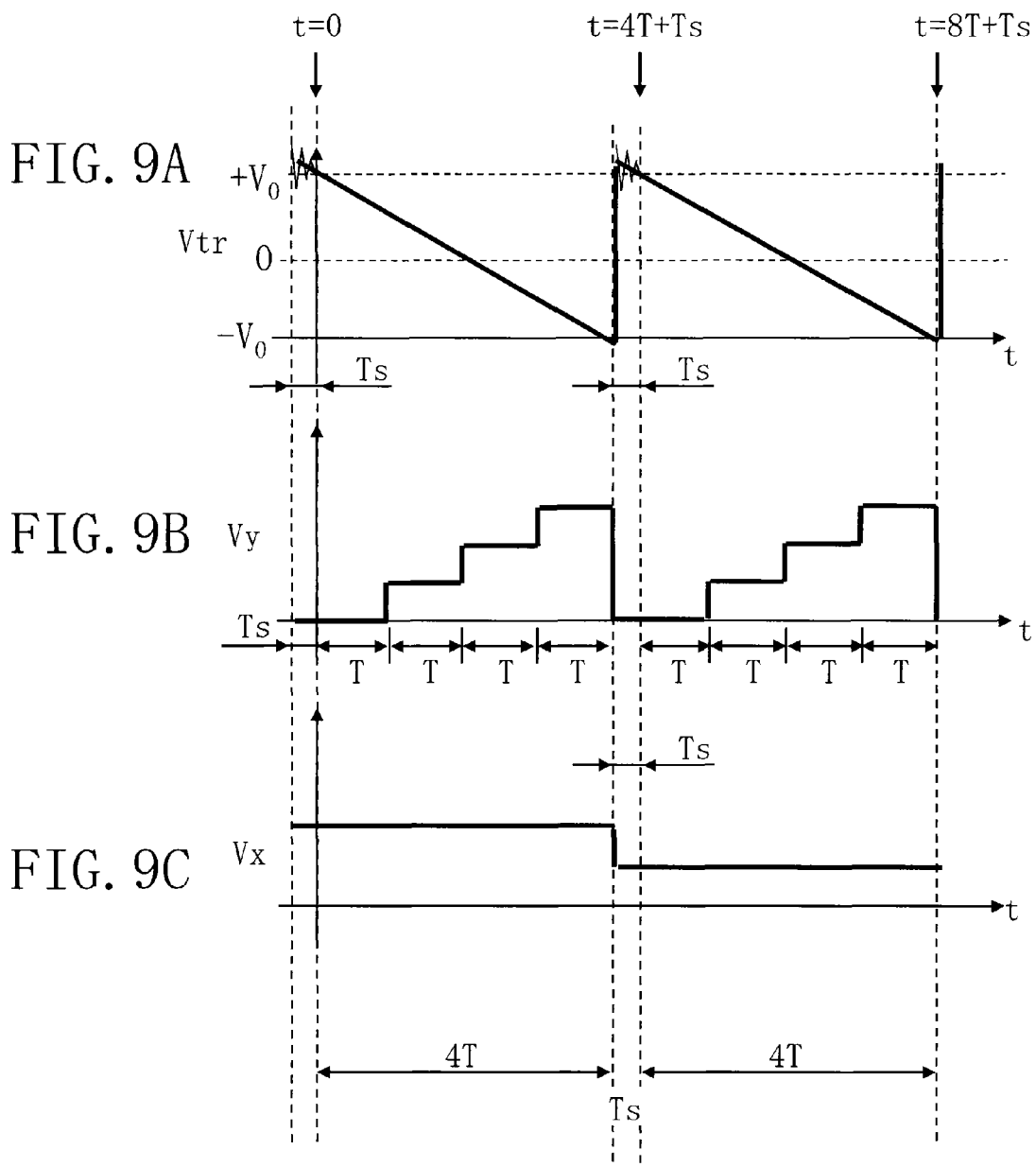
FIGS. 9A to 9C each illustrates a relation between a deflection voltage and a time according to the first embodiment.

FIGS. 9A to 9C each illustrates a relation between a deflection voltage and a time according to the first embodiment. In FIG. 9A, the ordinate axis shows a deflection voltage Vtr output from the DAC amplifier unit 134 for tracking, and the abscissa axis shows a time t. In FIG. 9B, the ordinate axis shows a deflection voltage Vy, in the y direction, output from the DAC amplifier unit 132 for the deflector 209, and the abscissa axis shows the time t. In FIG. 9C, the ordinate axis shows a deflection voltage Vx, in the x direction, output from the DAC amplifier unit 132 for the deflector 209, and the abscissa axis shows the time t. Although one DAC amplifier unit 132 is shown as a DAC amplifier unit for the deflector 209 in FIG. 1, when it is possible to deflect in the x and y directions, the deflector 209 is configured by four electrodes, for example, and a DAC amplifier unit is connected to each electrode. Moreover, although one DAC amplifier unit 134 is shown as a DAC amplifier unit for the deflector 208 in FIG. 1, when it is possible to deflect in the x and y directions, the deflector 208 is configured by four electrodes, for example, and a DAC amplifier unit is connected to each electrode. If it is possible to deflect only in the x direction, the deflector 209 is configured by two electrodes, for example, and a DAC amplifier unit is connected to each electrode.

FIGS. 9A to 9C show the case in which writing is performed by the writing method illustrated in FIG. 6. Beam deflection for tracking control is performed using the DAC amplifier unit 134 (first deflection amplifier) having a long settling time. Moreover, beam deflection for shifting the writing position of each beam in a grid is performed using the DAC amplifier unit 132 (second deflection amplifier) having a short settling time. Since the shift amount (shift distance) in a grid is fairly small compared with a tracking distance, the settling time can be fairly short. Thereby, deflection can be performed at a high speed. The short settling time of the DAC amplifier unit 132 can be a value ignorable when compared with the long settling time of the DAC amplifier unit 134, and further with the maximum writing time T per shot.

Therefore, first, when the settling time Ts of the DAC amplifier unit 134 has passed (t=0), writing processing of a grid concerned is started. As shown in FIG. 9A, since the tracking operation is continued until it becomes t=4T, the deflection voltage Vtr decreases linearly in the first-order proportion. On the other hand, as shown in FIG. 9B, since each shift in the y direction is performed every t=T, the deflection voltage Vy increases gradually every maximum writing time T per shot until it becomes t=4T. Moreover, as shown in FIG. 9C, since shifting in the x direction is performed every tracking cycle (t=4T+Ts), the deflection voltage Vx decreases gradually every 4T+Ts.

In the case described above, as shown in FIGS. 6 and 7, shifting is executed by the deflector 209 such that writing is performed for one column in the y direction in a grid by the same beam during a tracking cycle, but it is not limited thereto.

FIG. 10 shows another example of numbers of beams to write respective pixels in a grid concerned according to the first embodiment. FIG. 10 shows the case in which, using the beam (1), the first pixel from the right in the first row from the bottom of a grid concerned is exposed by the beam of the first shot during the time from t=0 to t=T. The XY stage 105 moves, for example, two beam pitches at a fixed speed in the −x direction during the time from t=0 to t=T. During this time period, the tracking operation is continued.

When it becomes the time t=T, the pixel to be written is shifted from the first pixel from the right in the first row from the bottom of the grid 26 concerned to the second pixel from the right in the first row from the bottom. Since the XY stage 105 is moving at a fixed speed also during this time period, the tracking operation is continued.

Then, using the beam (1), the second pixel from the right in the first row from the bottom of the grid 26 concerned is irradiated by the beam of the second shot during the time from t=T to t=2T, for example. The XY stage 105 moves, for example, two beam pitches at a fixed speed in the −x direction during the time from t=T to t=2T. During this time period, the tracking operation is continued.

When it becomes the time t=2T, the pixel to be written is shifted from the second pixel from the right in the first row from the bottom of the grid 26 concerned to the third pixel from the right in the first row from the bottom. Since the XY stage 105 is moving at a fixed speed also during this time period, the tracking operation is continued.

Then, using the beam (1), the third pixel from the right in the first row from the bottom of the grid 26 concerned is irradiated by the beam of the third shot during the time from t=2T to t=3T, for example. The XY stage 105 moves, for example, two beam pitches at a fixed speed in the −x direction during the time from t=2T to t=3T. During this time period, the tracking operation is continued.

When it becomes the time t=3T, the pixel to be written is shifted from the third pixel from the right in the first row from the bottom of the grid 26 concerned to the fourth pixel from the right in the first row from the bottom. Since the XY stage 105 is moving at a fixed speed also during this time period, the tracking operation is continued.

Then, using the beam (1), the fourth pixel from the right in the first row from the bottom of the grid 26 concerned is irradiated by the beam of the fourth shot during the time from t=3T to t=4T, for example. The XY stage 105 moves, for example, two beam pitches at a fixed speed in the −x direction during the time from t=3T to t=4T. During this time period, the tracking operation is continued. By what is described above, writing of the pixels in the first row from the bottom of the grid 26 concerned has been completed.

After emitting a corresponding beam to a corresponding writing position of each beam which has been shifted at least once, in this case three times, while continuing tracking control, the DAC amplifier 134 returns the tracking position to the tracking start position, where the tracking control was started, by resetting the beam deflection for tracking control.

Since writing of the pixels in the first row from the bottom of each grid has been completed, when tracking is reset, the deflector 209 performs deflection such that the writing position of each corresponding beam is adjusted (shifted) to coincide with the first pixel from the right in the second row from the bottom of each grid.

As shown in FIG. 10, by repeating operations described above, with respect to the grid 26 concerned, the pixels in the first row from the bottom are written by the beam (1), the pixels in the second row from the bottom are written by the beam (9), the pixels in the third row from the bottom are written by the beam (17), and the pixels in the fourth row from the bottom are written by the beam (25).

Although performing tracking by eight beam pitches is described in the example described above, it is not limited thereto.

FIG. 11 shows another example of numbers of beams to write respective pixels in a grid concerned according to the first embodiment. FIG. 11 shows a case of exposing two pixels during tracking the amount of four beam pitches. Using the beam (1), the first pixel from the right in the first row from the bottom of a grid concerned is exposed by the beam of the first shot during the time from t=0 to t=T. The XY stage 105 moves, for example, two beam pitches at a fixed speed in the −x direction during the time from t=0 to t=T. During this time period, the tracking operation is continued.

When it becomes the time t=T, the pixel to be written is shifted from the first pixel from the right in the first row from the bottom of the grid 26 concerned to the first pixel from the right in the second row from the bottom. Since the XY stage 105 is moving at a fixed speed also during this time period, the tracking operation is continued.

Then, using the beam (1), the first pixel from the right in the second row from the bottom of the grid 26 concerned is irradiated by the beam of the second shot during the time from t=T to t=2T, for example. The XY stage 105 moves, for example, two beam pitches at a fixed speed in the −x direction during the time from t=T to t=2T. During this time period, the tracking operation is continued.

After emitting a corresponding beam to a corresponding writing position of each beam which has been shifted at least once, in this case once, while continuing the tracking control, the DAC amplifier 134 returns the tracking position to the tracking start position, where the tracking control was started, by resetting the beam deflection for tracking control.

Since writing of the two first pixels from the right in the first and second rows from the bottom of each grid has been completed, when tracking is reset, the deflector 209 performs deflection such that the writing position of each corresponding beam is adjusted (shifted) to coincide with the second pixel from the right in the first row from the bottom of each grid.

As shown in FIG. 11, by repeating the operations described above, with respect to the grid 26 concerned, the two first pixels from the right in the first and second rows from the bottom are written by the beam (1), the two second pixels from the right in the first and second rows from the bottom are written by the beam (9), the two third pixels from the right in the first and second rows from the bottom are written by the beam (17), and the two fourth pixels from the right in the first and second rows from the bottom are written by the beam (25). The two first pixels from the right in the third and fourth rows from the bottom are written by the beam (5), the two second pixels from the right in the third and fourth rows from the bottom are written by the beam (13), the two third pixels from the right in the third and fourth rows from the bottom are written by the beam (21), and the two fourth pixels from the right in the third and fourth rows from the bottom are written by the beam (29).

FIG. 12 shows another example of numbers of beams to write respective pixels in a grid concerned in a comparative example of the first embodiment. FIG. 12 shows a case of exposing one pixel while performing tracking the amount of two beam pitches. In FIG. 12, similarly to a conventional method, tracking is reset every maximum writing time T. In such a case, as shown in FIG. 12, pixels in the first column from the right are written from the bottom by the beams (1), (3), (5), (7), . . . , for example.

In the examples of FIGS. 6, 7, and 10, since a tracking cycle of 4 times is needed in order to write the inside of a grid, 4×(4T+Ts) is needed for the writing time. On the other hand, in the comparative example shown in FIG. 12, when performing tracking reset for each shot similarly to the conventional method, since a tracking cycle of 4×4 times is needed in order to write the inside of a grid, 16×(T+Ts) is needed for the writing time. Therefore, according to the first embodiment, it is possible to greatly reduce the writing time. Moreover, in the example of FIG. 11, since a tracking cycle of 8 times is needed in order to write the inside of a grid, 8×(4T+Ts) is needed for the writing time. Thus, even in this case, the writing time can be sufficiently reduced compared with the comparative example shown in FIG. 12. In other words, if shifting of a pixel to be written is performed at least once in one tracking cycle, an effect depending upon the number of shifting times can be produced.

That is, the larger the tracking cycle becomes by as much as increasing the tracking distance where the tracking cycle is included, the shorter the writing time becomes as the Ts influence is reduced. When the tracking distance increases, tracking deflection also increases, which causes distortion of the electron optical system due to the deflection, thereby degrading the writing precision because beam positional deviation occurs on the surface of the target object. Therefore, it is preferable to increase the tracking distance as much as possible within the range where distortion of the electron optical system due to the deflection can be allowed. It is preferably that a center of a deflection region of the deflector 208 using for the tracking control is arranged at a position between a tracking start position and a tracking end position while performing the beam deflection for the tracking control, to reduce the distortion of the electron optical system due to the deflection and to increase the tracking distance. It is more preferably that the tracking control is performed so that absolute values of deflection amounts of a tracking start position and a tracking end position have a same value each other and the deflection amounts of the tracking start position and the tracking end position have an opposite polarity each other. Specifically, a timing and the number k' of times of the tracking start step (S102) is controlled so that an output of the DAC amplifier 134 becomes $-V_0$ in a tracking start position and an output of the DAC amplifier 134 becomes $+V_0$ in a tracking end position, to reduce the distortion of the electron optical system due to the deflection and to increase the tracking distance.

For the sake of simplicity, in the above description, the settling time Tss of deflection for shifting a pixel by the high-speed deflection DAC amplifier 132 has been ignored as being small enough not to affect the writing period. On the other hand, it is desirable to perform control considering Tss in view of the writing precision. It is possible to remove the influence of beam positional deviation caused by the settling time of deflection for shifting a pixel, by delaying exposure start by Tss after pixel shifting by defining the pixel shifting cycle as T'=T+Tss.

According to the first embodiment, the number of resetting times in tracking control can be reduced as described above. Therefore, the number of generation times of the settling time of the DAC amplifier unit 134 for tracking control can be reduced. Consequently, the writing time can be shortened.

Second Embodiment

Although in the first embodiment the structure is configured by separating the deflector 208 for tracking and the DAC amplifier unit 134 from the deflector 209 for position deflection (shifting) and the DAC amplifier unit 132, it is not limited thereto.

Figure 13:
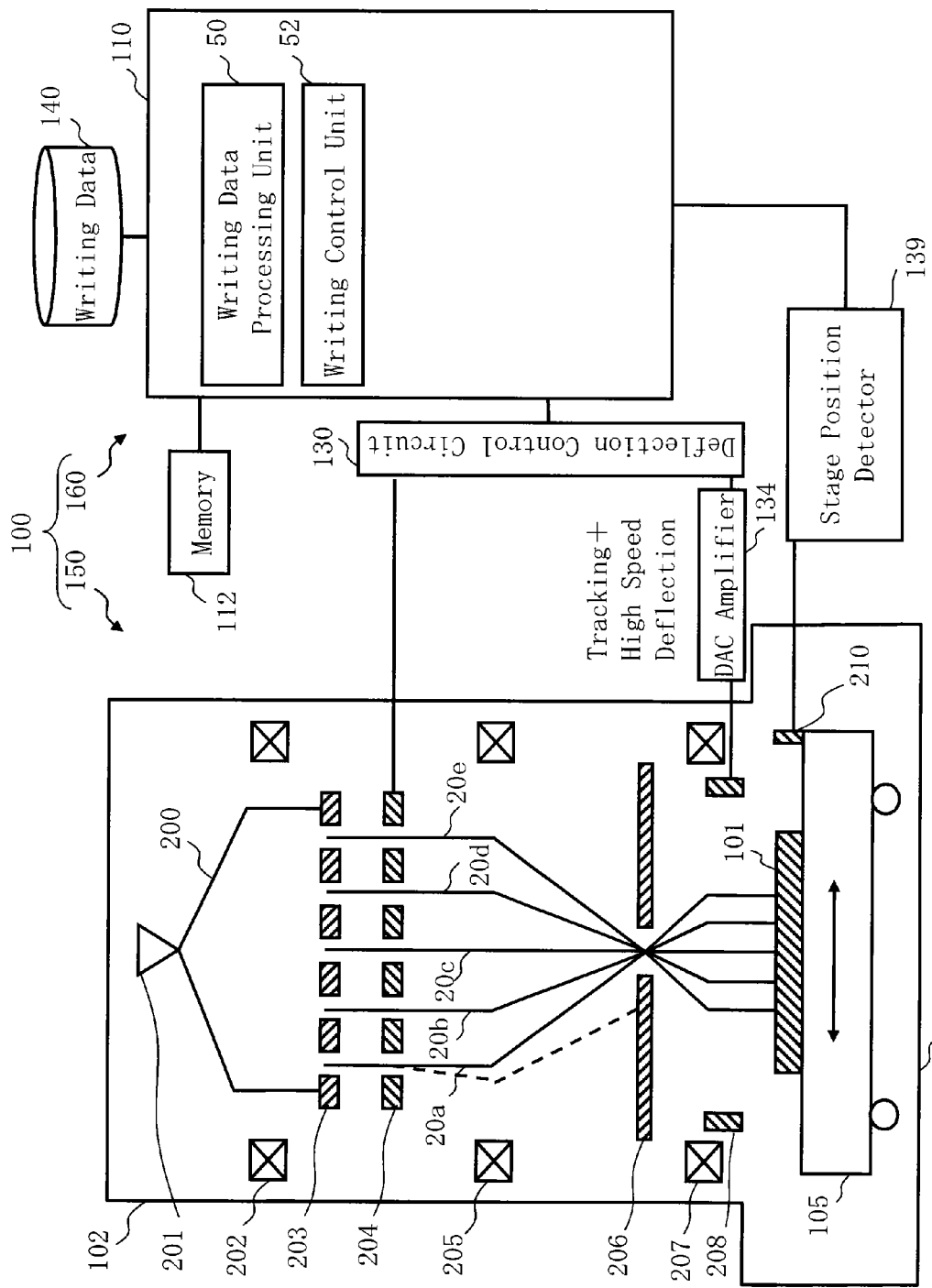
FIG. 13 is a schematic diagram showing the configuration of a writing apparatus according to the second embodiment.

FIG. 13 is a schematic diagram showing the configuration of a writing apparatus according to the second embodiment. FIG. 13 is the same as FIG. 1 except that the deflector 209 and the DAC amplifier unit 132 are not provided. According to the second embodiment, both the deflection for tracking and the deflection for position deflection (shifting) are performed by the deflector 208 and the DAC amplifier unit 134. Main steps of the writing method according to the second embodiment are the same as those in FIG. 3. The contents of the present embodiment are the same as those of the first embodiment except what is described below.

According to the second embodiment, the deflector 208 collectively deflects respective beams in the "on" state having passed through the blanking aperture member 206 to writing positions of the respective beams, and collectively deflects respective beams in such a way as to follow the movement of the XY stage 105. The deflection control circuit 130 controls the deflector 208 to deflect each beam to a corresponding writing position, and after the maximum writing time T has passed, to deflect each beam to be shifted to a next corresponding writing position of each beam. In addition, the deflection control circuit 130 controls the deflector 208 to continue tracking of each beam while each beam irradiates the writing position and while each beam irradiates the writing position which has been shifted at least once, and after each beam irradiates the writing position which has been shifted at least once, to return the tracking position to the tracking start position, where the tracking control was started, by resetting the beam deflection for tracking control. Specifically, tracking deflection data should be added to position deflection data, to be output to the DAC amplifier.

The embodiments have been explained referring to concrete examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing method and multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
a stage configured to mount a target object thereon and to be continuously movable;
an emission unit configured to emit a charged particle beam;
an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
a blanking plate in which there are arranged a plurality of blankers configured to respectively perform blanking deflection for a corresponding beam of the multiple beams having passed through the plurality of openings of the aperture member;
a blanking aperture member configured to block each beam having been deflected to be in an "off" state by at least one of the plurality of blankers;
a first deflector configured to collectively deflect each beam in an "on" state having passed through the blanking aperture member to a writing position of the each beam;
a second deflector configured to collectively deflect the each beam in the "on" state having passed through the blanking aperture member in such a way as to follow a movement of the stage; and
a deflection control unit configured to control the first deflector to deflect the each beam to a corresponding writing position, and after a writing time has passed, to deflect the each beam to be shifted to a next corresponding writing position, and to control the second deflector to continue tracking of the each beam without shifting a beam deflection for tracking control while the each beam irradiates the writing position and while the each beam irradiates the writing position which has been shifted at least once, and after the each beam irradiates the writing position which has been shifted at least once, to return a tracking position such that a next tracking start position is a former tracking start position where the tracking control was started, by resetting the beam deflection for the tracking control, wherein the writing position is an irradiation region which can be irradiated by one-shot of the each beam,
wherein a tracking distance in a direction of tracking from starting tracking control to resetting beam deflection of the tracking control is smaller than a size of the irradiation region which can be irradiated by one-shot.

2. A multi charged particle beam writing apparatus comprising:
a stage configured to mount a target object thereon and to be continuously movable;
an emission unit configured to emit a charged particle beam;
an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
a blanking plate in which there are arranged a plurality of blankers configured to respectively perform blanking deflection for a corresponding beam of the multiple beams having passed through the plurality of openings of the aperture member;
a blanking aperture member configured to block each beam having been deflected to be in an "off" state by at least one of the plurality of blankers;
a deflector configured to collectively deflect the each beam in an "on" state having passed through the blanking aperture member to a writing position of the each beam, and collectively deflect the each beam in such a way as to follow a movement of the stage; and
a deflection control unit configured to control the deflector to deflect the each beam to a corresponding writing position, and after a writing time has passed, to deflect the each beam to be shifted to a next corresponding writing position, and to control the deflector to continue tracking of the each beam without shifting the beam deflection for the tracking control while the each beam irradiates the writing position and while the each beam irradiates the writing position which has been shifted at least once, and after the each beam irradiates the writing position which has been shifted at least once, to return a tracking position such that a next tracking start position is a former tracking start position where the tracking control was started, by resetting the beam deflection for the tracking control, wherein the writing position is an irradiation region which can be irradiated by one-shot of the each beam,
wherein a tracking distance in a direction of tracking from starting tracking control to resetting beam deflection of the tracking control is smaller than a size of the irradiation region which can be irradiated by one-shot.

3. A multi charged particle beam writing method comprising:
emitting each of respective charged particle beams in an "on" state of multi charged particle beams to a writing position of an irradiation region which can be irradiated by one-shot of each respective beam during a corresponding writing time within a maximum writing time which was pre-set, while performing a beam deflection for tracking control such that the writing position of the each respective beam of the multi charged particle beams collectively follow a movement of a stage;
shifting the writing position of the each respective beam to a next writing position of the each respective beam by performing another beam deflection of the multi charged particle beams, in addition to the beam deflection for the tracking control, while continuing the beam deflection for the tracking control without shifting the beam deflection for the tracking control after the maximum writing time has passed;
emitting the each respective beam in the "on" state of the multi charged particle beams to the next writing position having been shifted of the each respective beam, during a corresponding writing time within the maximum writing time while continuing the tracking control; and
returning a tracking position such that a next tracking start position is a former tracking start position where the tracking control was started, by resetting the beam deflection for the tracking control after emitting the each corresponding beam to the next writing position having been shifted at least once of the each respective beam while continuing the tracking control, wherein a tracking distance in a direction of tracking from starting tracking control to resetting beam deflection of the tracking control is smaller than a size of the irradiation region which can be irradiated by one-shot.

4. The method according to claim 3, wherein
the beam deflection for the tracking control is performed using a first deflection amplifier having a long settling time, and
the another beam deflection for shifting the writing position of the each respective beam is performed using a second deflection amplifier having a short settling time.

5. The method according to claim 3, wherein
the tracking control is performed repeatedly after resetting the beam deflection, and
the tracking distance in a direction of tracking of the tracking control is substantially a same in each respective tracking control.

6. The method according to claim 3, wherein
in a case of resetting the beam deflection for the tracking control, the tracking position is returned to a position being away by a predetermined distance from the former tracking start position where the tracking control was started.

7. The method according to claim 6, wherein
the predetermined distance is larger than a distance obtained by using a stage speed and a settling time of an amplifier for the tracking control.

8. The method according to claim 7, wherein
the tracking position becomes a former tracking start position where the tracking control was started, after returning and the settling time had passed.

9. The method according to claim 3, further comprising:
shifting the writing position of the each corresponding beam simultaneously with returning the tracking position.

10. The method according to claim 9, wherein
a position to which the writing position of the each respective beam is shifted simultaneously with the tracking position being returned is a place where nothing has yet been written.

11. The method according to claim 3, wherein a deflector used for the tracking control has a deflection region, and a center of the deflection region is arranged at a position between a tracking start position of the tracking control and a tracking end position of the tracking control while performing the beam deflection for the tracking control.

12. The method according to claim 3, wherein a deflector performs the beam deflection for the tracking control,
the tracking control is performed so that an absolute value of a deflection amount by which the deflector performs the beam deflection to a tracking start position of the tracking control and an absolute value of a deflection amount by which the deflector performs the beam deflection to a tracking end position have a same value as each other and the deflection amounts of the tracking start position and the tracking end position have an opposite polarity each other, and each of a respective next beam in a next "on" state of the multi charged particle beams in a next tracking start position is deflected at a next writing position at which a beam has not been emitted.

* * * * *